United States Patent
Choo et al.

(10) Patent No.: US 7,148,157 B2
(45) Date of Patent: Dec. 12, 2006

(54) USE OF PHOSLON (PNO) FOR BORDERLESS CONTACT FABRICATION, ETCH STOP/BARRIER LAYER FOR DUAL DAMASCENE FABRICATION AND METHOD OF FORMING PHOSLON

(75) Inventors: Hsia Liang Choo, Singapore (SG); John Sudijono, Singapore (SG); Liu Huang, Singapore (SG); Tan Juan Boon, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/278,133

(22) Filed: Oct. 22, 2002

(65) Prior Publication Data

US 2004/0077181 A1    Apr. 22, 2004

(51) Int. Cl.
*H01L 21/31* (2006.01)
*H01L 21/469* (2006.01)

(52) U.S. Cl. .............................. 438/784; 257/E21.269; 257/E21.576; 257/E21.579

(58) Field of Classification Search ................ 438/585, 438/591, 597, 634, 637–640, 784; 423/302, 423/304, 371
See application file for complete search history.

(56) References Cited

U.S. PATENT DOCUMENTS

| | | | | |
|---|---|---|---|---|
| 4,172,158 A | 10/1979 | Li | ................................ | 427/85 |
| 5,384,281 A | 1/1995 | Kenney et al. | ............. | 437/189 |
| 5,567,651 A * | 10/1996 | Berti et al. | ................. | 438/303 |
| 5,811,357 A * | 9/1998 | Armacost et al. | ........... | 438/723 |
| 6,072,237 A | 6/2000 | Jang et al. | ................... | 257/698 |
| 6,100,205 A * | 8/2000 | Liu et al. | ..................... | 438/788 |
| 6,114,233 A * | 9/2000 | Yeh | ........................... | 438/622 |
| 6,194,762 B1 | 2/2001 | Yamazaki et al. | .......... | 257/350 |
| 6,239,026 B1 | 5/2001 | Liu et al. | .................... | 438/637 |
| 6,274,517 B1 | 8/2001 | Hsia | .......................... | 438/783 |

OTHER PUBLICATIONS

Li et al. , "CVD Growth and Properties of "Phoslon", Dielectric Films", J. Electrochem. :Soc. Solid-State Science and Technology, Feb. 1986, pp. 366-372.*

* cited by examiner

*Primary Examiner*—Alexander Ghyka

(57) ABSTRACT

A method of forming phoslon (PNO) comprising the following steps. A CVD reaction chamber having a reaction temperature of from about 300 to 600° C. is provided. From about 10 to 200 sccm $PH_3$ gas, from about 50 to 4000 sccm $N_2$ gas and from about 50 to 1000 sccm $NH_3$ gas are introduced into the CVD reaction chamber. Either from about 10 to 200 sccm $O_2$ gas or from about 50 to 1000 sccm $N_2O$ gas is introduced into the CVD reaction chamber. An HFRF power of from about 0 watts to 4 kilowatts is also employed. An LFRF power of from about 0 to 5000 watts may also be employed. Employing a phoslon etch stop layer in a borderless contact fabrication. Employing a phoslon lower etch stop layer and/or a phoslon middle etch stop layer in a dual damascene fabrication.

29 Claims, 3 Drawing Sheets

USE OF PHOSLON (PNO) FOR BORDERLESS CONTACT FABRICATION, ETCH STOP/BARRIER LAYER FOR DUAL DAMASCENE FABRICATION AND METHOD OF FORMING PHOSLON

FIELD OF THE INVENTION

The present invention relates generally to fabrication of semiconductor devices, and more specifically to methods of forming phoslon and using phoslon in the fabrication of semiconductor devices.

BACKGROUND OF THE INVENTION

As complimentary metal-oxide semiconductor (CMOS) device dimensions are scaled down, borderless contacts become necessary in order to fulfill the stringent design rule and to provide wider process margins to accommodate the misalignment during contact masking. For borderless contact schemes, a layer of dielectric film is needed to function as an etch stop layer (ESL). This etch-stop layer protects the shallow-trench-isolation (STI) oxide during the contact-hole anisotropic plasma-etching process. Prevention of excessive STI oxide loss is crucial in order to minimize current leakage through the active-isolation region.

Current borderless contact practices use silicon nitride (SiN) and/or silicon oxynitride (SiON) as the ESL. Current dual damascene fabrication practices use SiN and/or SiCO, SiCN or SIC as the etch stop layer/barrier layer.

Etch selectivity remains an issue for both of these current practices as these materials are silicon-based and standard etch chemistry would be challenging for advanced aspect-ratio etching.

U.S. Pat. No. 6,274,517 B1 to Hsia describes a method of fabricating a PNO (phoslon) spacer.

U.S. Pat. No. 6,194,762 B1 to Yamazaki et al. describes a borderless process using SiN as the etch stop layer.

U.S. Pat. No. 6,072,237 to Jang et al. describes a method for forming a borderless contact structure with a SiN etch stop layer.

U.S. Pat. No. 5,384,281 to Kenney et al. describes a process for etching narrow features, particularly submicron borderless contacts using an SiN etch stop layer.

U.S. Pat. No. 6,239,026 B1 to Liu et al. describes reducing poisoned vias in submicron process technology by reducing the occurrence of over-etched vias through the inclusion of an etch stop layer.

U.S. Pat. No. 4,172,158 to Li describes a method of forming an amorphous phosphorus-nitrogen-oxygen (PNO or phoslon) material.

SUMMARY OF THE INVENTION

Accordingly, it is an object of the present invention to provide a method of forming phoslon (PNO).

Another object of the present invention is to provide a method of using phoslon (PNO) for borderless contact fabrication.

Yet another object of the present invention is to provide a method of using phoslon (PNO) for etch stop/barrier layer for dual damascene fabrication.

Other objects will appear hereinafter.

It has now been discovered that the above and other objects of the present invention may be accomplished in the following manner. Specifically, a CVD reaction chamber having a reaction temperature of from about 300 to 600° C. is provided. From about 10 to 200 sccm $PH_3$ gas, from about 50 to 4000 sccm $N_2$ gas and from about 50 to 1000 sccm $NH_3$ gas are introduced into the CVD reaction chamber. Either from about 10 to 200 sccm $O_2$ gas or from about 50 to 1000 sccm $N_2O$ gas is introduced into the CVD reaction chamber. An HFRF power of from about 0 watts to 4 kilowatts is also employed. An LFRF power of from about 0 to 5000 watts may also be employed. Employing a phoslon etch stop layer in a borderless contact fabrication. Employing a phoslon lower etch stop layer and/or a phoslon middle etch stop layer in a dual damascene fabrication.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Method of Forming PNO (Phoslon)

In accordance with the present invention, synthesis of PNO (phoslon) may be achieved using a commercially available HDPCVD tool or a PECVD tool. $PH_3$, $N_2$, $NH_3$ and $O_2$ are used in the high density plasma chemical vapor deposition (HDPCVD) process while $PH_3$, $N_2$, $NH_3$ and $N_2O$ are used in the plasma enhanced chemical vapor deposition (PECVD) process.

The preferred HDPCVD tool is known as the Ultima™ tool \manufactured by AMAT or the SPEED™ tool manufactured by NVLS. The preferred PECVD tool is known as the Producer™ tool manufactured by AMAT or the SEQUAL™ tool manufactured by NVLS.

Further, for the HDPCVD process:

temperature: preferably from about 300 to 600° C. and more preferably from about 350 to 550° C.;

$PH_3$ gas flow: preferably from about 10 to 200 sccm and more preferably from about 30 to 150 sccm;

$N_2$ gas flow: preferably from about 50 to 4000 sccm and more preferably from about 100 to 3000 sccm;

$NH_3$ gas flow: preferably from about 50 to 1000 sccm and more preferably from about 100 to 800 sccm;

$O_2$ gas flow: preferably from about 10 to 200 sccm and more preferably from about 30 to 150 sccm;

HFRF power: preferably from about 0 watts to 4 kilowatts and more preferably from about 100 watts to 3.5 kilowatts; and LFRF power: preferably from about 1000 watts to 5000 watts and more preferably from about 1500 watts to 4500 watts.

Further, for the PECVD process:

temperature: preferably from about 300 to 600° C. and more preferably from about 350 to 550° C.;

$PH_3$ gas flow: preferably from about 10 to 200 sccm and more preferably from about 30 to 150 sccm;

$N_2$ gas flow: preferably from about 50 to 4000 sccm and more preferably from about 100 to 3000 sccm;

NH$_3$ gas flow: preferably from about 50 to 1000 sccm and more preferably from about 100 to 800 sccm;

N$_2$O gas flow: preferably from about 50 to 1000 sccm and more preferably from about 100 to 800 sccm;

HFRF power: preferably from about 50 to 1000 watts and more preferably from about 100 watts to 700 watts; and LFRF power: preferably from about 0 to 1000 watts and more preferably from about 50 to 700 watts.

The advantages of synthesizing phoslon in accordance with one or more of the above embodiments of the present invention include:

1) uniform and stable film; and
2) high throughput.

Figure 3:
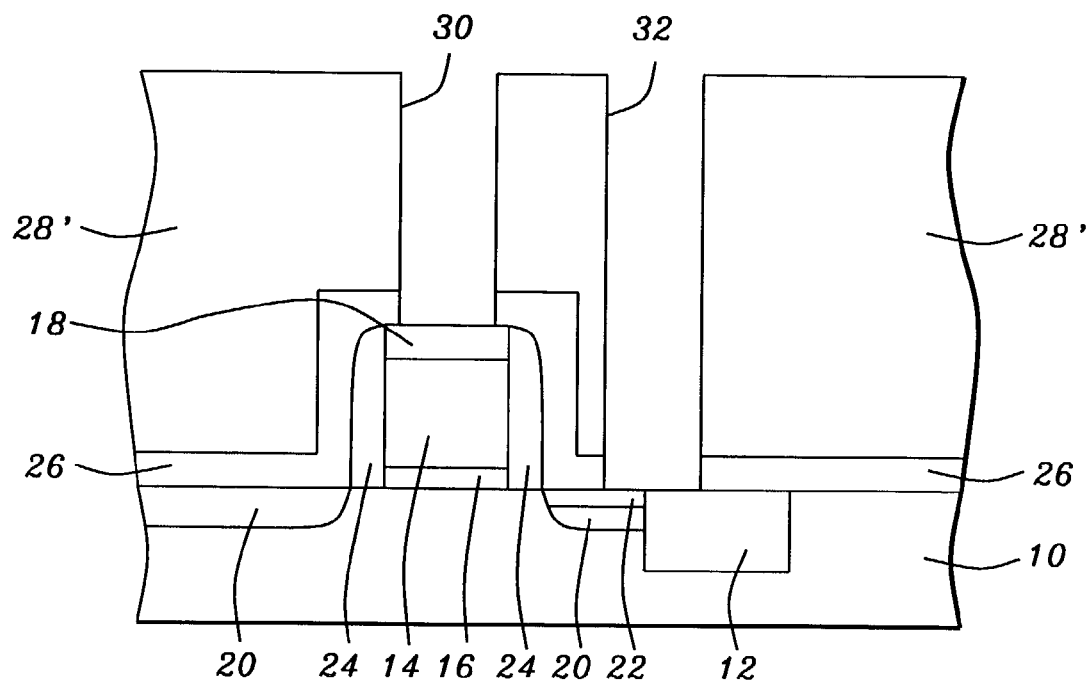
Figure 4:
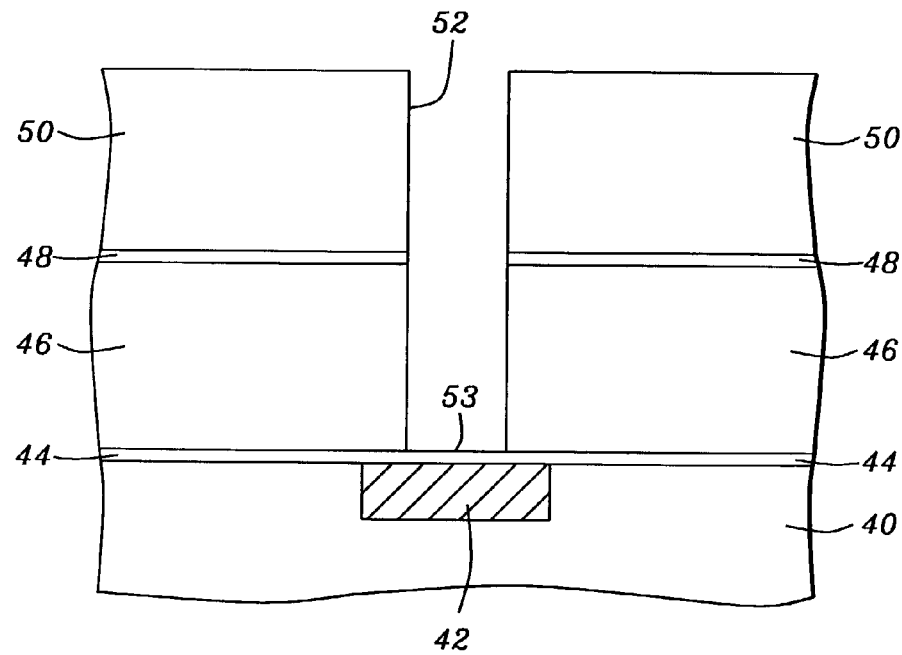
FIGS. 4 and 5 schematically illustrate in cross-sectional representation a second preferred embodiment of the present invention.
Figure 5:
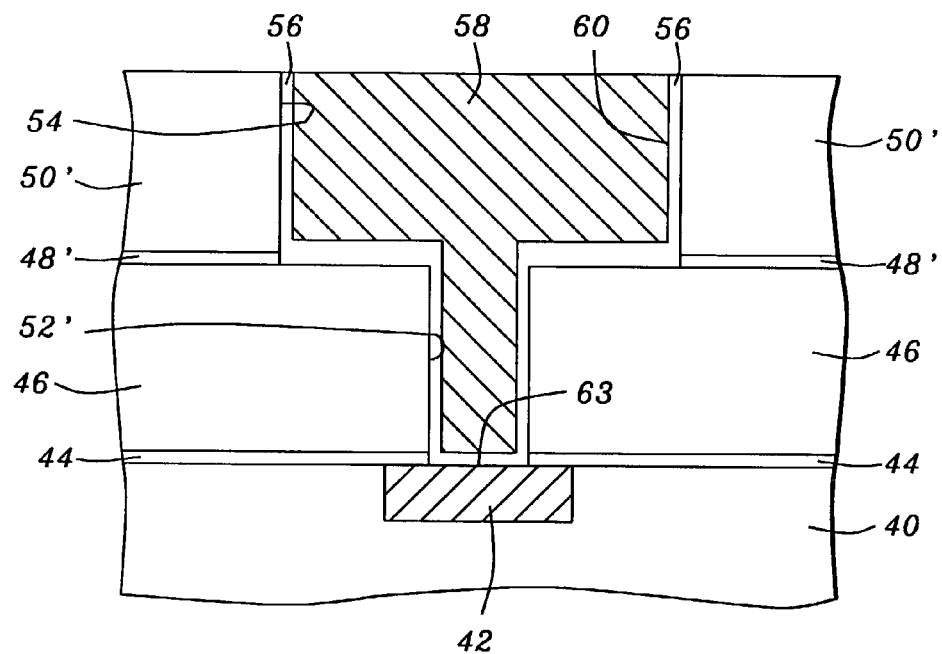

The inventors have discovered that phoslon, and specifically, the phoslon synthesized in accordance with the present invention is admirable suited for use as:

a) an etch stop layer (ESL) in a borderless contact fabrication (see FIGS. 1 to 3);
b) an etch stop layer (ESL) in a dual damascene fabrication (see FIGS. 4 and 5); and
c) a barrier layer in a dual damascene fabrication (see FIGS. 4 and 5)

because:

a) the non-silicon based phoslon layers provide good etch selectivity;

b) ESLs and barrier layers comprised of phoslon may have tunable reflective index (n) and dielectric constant (k) values for lowering the effective k values as well as controlling etch selectivity; by changing the PH$_3$, NH$_3$, N$_2$ and O$_2$/N$_2$O gas flow ratios the film compositions will change and the reflective index (n) and dielectric constant (k) will also change accordingly;

c) a buffering capability is achieved through the phosphorous (P) in that phoslon films will help to block mobile ion diffusion to the transistor which is important when used as an ESL in a borderless contact process/structure;

d) phoslon is very stable as it contains phosphorous, nitrogen and oxygen (PNO) but not silicon (Si) and is thus inert to almost all chemicals commonly used in the semiconductor industry and so has a much higher etch selectivity to oxide (SiO$_2$) as compared to SiN and SiON;

e) the dielectric breakdown strength (dielectric breakdown voltage) of phoslon is far better than SiN; and f) good barrier to prevent metal, i.e. e.g. copper (Cu), from diffusing into dual damascene dielectric layers.

Figure 1:
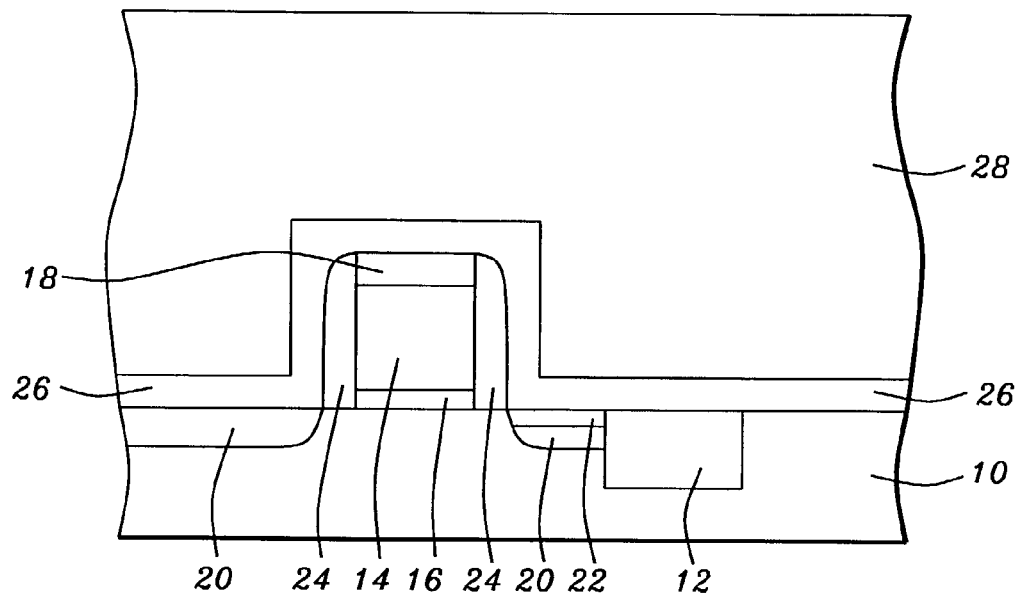
FIGS. 1 to 3 schematically illustrate in cross-sectional representation a first preferred embodiment of the present invention.
Figure 2:
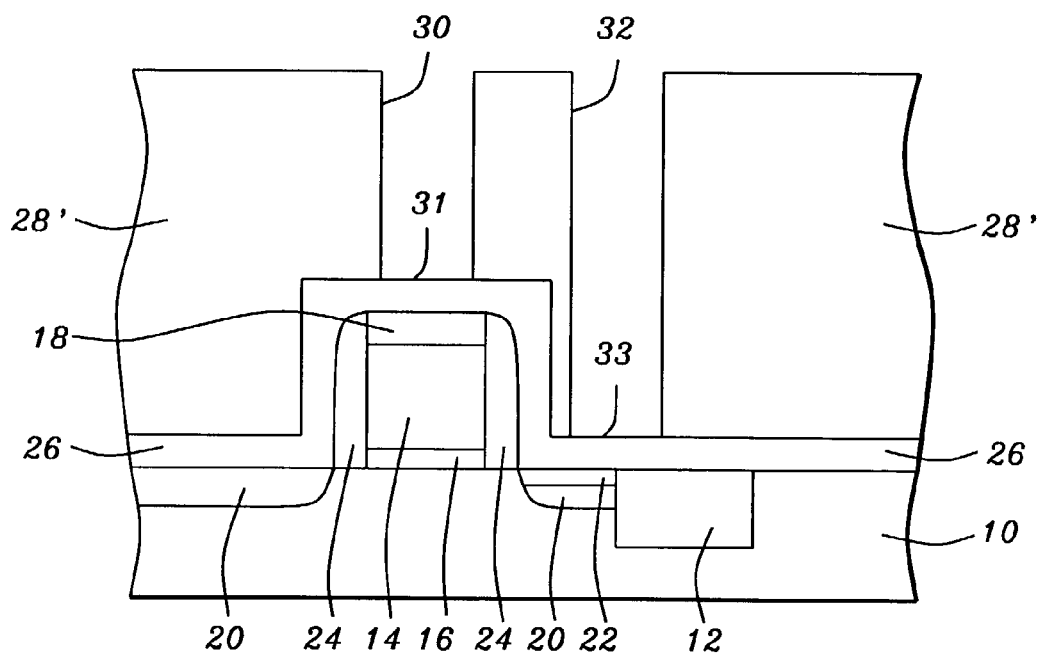

Use of Phoslon Etch Stop Layer 26 in Borderless Contact Fabrication; FIGS. 1 to 3

As shown in FIG. 1, substrate 10 may have an isolation structure 12 formed therein. Isolation structure 12 may be, for example, a shallow trench isolation (STI) structure comprised of silicon oxide.

Substrate 10 is preferably comprised of silicon (Si) or germanium (Ge), is more preferably a silicon substrate and is understood to possibly include a semiconductor wafer or substrate.

A gate electrode 14 having an underlying gate oxide layer 16 is formed over substrate 10 proximate isolation structure 12. Gate electrode 14 has sidewall spacers 24 and may have an overlying gate silicide portion 18. Source/drain (S/D) implants 20 are formed within the substrate 10 outboard the sidewall spacers 24 and a S/D silicide portion 22 may be formed the S/D implants as shown in FIG. 1.

An etch stop layer (ESL) 26 comprised of phoslon, and more preferably phoslon synthesized in accordance with the present invention, is formed over the substrate 10 and the gate electrode 14 to a thickness of preferably from about 100 to 1000 Å and more preferably from about 200 to 500 Å.

The phoslon ESL 26 has a reflective index (n) value of preferably from about 1.6 to 2.2 and more preferably from about 1.8 to 2.0; and has a dielectric constant (k) value of preferably from about 5.0 to 9.0 and more preferably from about 6.0 to 7.0.

A dielectric layer 28 is then formed over the phoslon ESL 26 which may comprise multiple dielectric sub-layers. Dielectric layer 28 is preferably comprised of high density plasma (HDP) undoped silica glass (USG), HDP phosphosilicate glass (PSG), sub-atmospheric (SA) boro phosphosilicate (BPSG), plasma-enhanced (PE) TEOS or PE PSG and is more preferably HDP USG or HDP PSG.

As shown in FIG. 2, respective borderless contacts 30, 32 are then patterned through dielectric layer 28 over the gate silicon portion 18/gate electrode 14 to expose a first portion 31 of the phoslon ESL 26 and over at least a portion of the S/D silicide portion 22 to expose a second portion 33 of the phoslon ESL 26. The high etch selectivity of the phoslon ESL 26 compared to the dielectric layer 28 improves the etch process.

As shown in FIG. 3, the first exposed phoslon ESL portion 31 and the second exposed phoslon ESL portion 33 are removed using a dry etch process. Since the high etch selectivity of the phoslon ESL portions 31, 33 vis a vis the isolation structure 12 material and the gate silicide portion 18, the ESL removal dry etch process can stop on the top of STI 12 and gate silicide portion 18 without STI gouging.

Use of Phoslon Etch Stop Layer(s) 44, 48 Dual Damascene Fabrication; FIGS. 4 and 5

As shown in FIG. 4, substrate 40 is preferably comprised of silicon (Si), germanium (Ge) or gallium arsenide (GaAs), is more preferably a silicon substrate and is understood to possibly include a semiconductor wafer or substrate.

An exposed metal structure 42 is formed into substrate 10. Metal structure 42 is preferably comprised of copper, aluminum, silver, gold, platinum or tungsten and is more preferably comprised of copper (Cu).

A lower etch stop layer (ESL) and metal barrier layer 44 comprised of Phoslon, and more preferably phoslon synthesized in accordance with the present invention, may be formed over substrate 40 and exposed metal structure 42 to a thickness of from about 100 to 1000 Å and more preferably from about 200 to 700 Å.

Lower phoslon ESL and metal barrier layer 44 has a reflective index (n) value of preferably from about 1.6 to 2.2 and more preferably from about 1.8 to 2.0; and has a dielectric constant (k) value of preferably from about 5.0 to 9.0 and more preferably from about 6.0 to 7.0.

A first dielectric layer 46 is then formed over the lower phoslon ESL 44 to a thickness of preferably from about 1500 to 7000 Å and more preferably from about 2000 to 6000 Å. First dielectric layer 46 is preferably comprised of USG, FSG, BLACK DIAMOND™ from AMAT, Coral™ from NVLS or other low-k dielectric materials and is more preferably comprised of FSG, BLACK DIAMOND™ from AMAT or Coral™ from NVLS.

A middle etch stop layer (ESL) 48 comprised of phoslon, and more preferably phoslon synthesized in accordance with the present invention, may then be formed over the first dielectric layer 46 to a thickness of from about 100 to 1000 Å and more preferably from about 200 to 700 Å.

Middle phoslon ESL 48 has reflective index (n) value of preferably from about 1.6 to 2.2 and more preferably from about 1.8 to 2.0; and has a dielectric constant (k) value of preferably from about 5.0 to 9.0 and more preferably from about 6.0 to 7.0.

A second dielectric layer 50 is then formed over the middle phoslon ESL 48 to a thickness of preferably from about 2000 to 10,000 Å and more preferably from about 2500 to 9000 Å. Second dielectric layer 50 is preferably comprised of USG, FSG, BLACK DIAMOND™ from AMAT, Coral™ from NVLS or other low-k dielectric materials and is more preferably comprised of FSG, BLACK DIAMOND™ from AMAT or Coral™ from NVLS.

The second dielectric layer 50, middle phoslon ESL 48 and the first dielectric layer 46 are patterned and etched to form a via opening 52 exposing a portion 53 of the lower phoslon ESL and metal barrier layer 44.

As shown in FIG. 5, the second dielectric layer 50 is again patterned and etched, stopping on middle phoslon ESL 48, to form trench opening 54 overlying the remaining portion of via opening 52'. Trench opening 54 and remaining via opening 52' comprise dual damascene opening 60.

The portion 53 of the lower phoslon ESL and metal barrier layer 44 is removed exposing a portion 63 of metal structure 42.

A barrier layer 56 comprised of Ta, TaN, Ti or TiN, and more preferably Ta or TaN may be formed within dual damascene opening 60, lining dual damascene opening 60. Barrier layer 56 has a thickness of preferably from about 50 to 3000 Å and more preferably from about 100 to 250 Å.

A planarized metal dual damascene structure 58 may then be formed within dual damascene opening 60. Metal dual damascene structure 58 is preferably comprised of copper, aluminum, silver, gold, platinum or tungsten and more preferably copper (Cu).

ADVANTAGES OF THE INVENTION

The advantages of one or more embodiments of the present invention further include:

1) the non-silicon based phoslon layers provide good etch selectivity;

2) ESLs and barrier layers comprised of phoslon may have tunable reflective index (n) and dielectric constant (k) values for lowering the effective k values as well as controlling etch selectivity;

3) a buffering capability is achieved through the phosphorus (P) in the phoslon films will help to block mobile ion diffusion to transistor when phoslon is used as an ESL in borderless contact process/structures;

4) the dielectric breakdown strength of phoslon is far better than SiN; and 5) phoslon is a good barrier to prevent Cu from diffusing into dual damascene dielectric layers.

While particular embodiments of the present invention have been illustrated and described, it is not intended to limit the invention, except as defined by the following claims.

We claim:

1. A method of forming borderless contact openings, comprising the steps of:

providing a substrate having a gate electrode formed thereover; the gate electrode having a gate silicide layer formed thereover;

forming source/drain implants into the substrate proximate the gate electrode;

forming a phoslon etch stop layer over the substrate and over the gate electrode;

forming a dielectric layer over the phoslon etch stop layer; and patterning and etching the dielectric layer and the phoslon etch stop layer to form at least one borderless contact opening over at least the gate electrode or at least one of the source/drain implants.

2. The method of claim 1, wherein the phoslon etch stop layer is from about 100 to 1000 Å thick.

3. The method of claim 1, wherein the phoslon etch stop layer is from about 200 to 500 Å thick.

4. The method of claim 1, wherein the phoslon etch stop layer has a reflective index value of from about 1.6 to 2.2 and a dielectric constant value of from about 5.0 to 9.0.

5. The method of claim 1, wherein the phoslon etch stop layer has a reflective index value of from about 1.8 to 2.0 and a dielectric constant value of from about 6.0 to 7.0.

6. The method of claim 1, wherein at least one of the source/drain implants has an overlying silicide portion.

7. The method of claim 1, wherein the substrate is comprised of a material selected from the group consisting of silicon and germanium.

8. The method of claim 1, wherein the substrate is a silicon substrate.

9. The method of claim 1, wherein the phoslon etch stop layer is formed using the following steps:

providing a chemical vapor deposition (CVD) reaction chamber having a reaction temperature of from about 300 to 600° C.;

introducing from about 10 to 200 sccm $PH_3$ gas, from about 50 to 4000 sccm $N_2$ gas and from about 50 to 1000 sccm $NH_3$ gas into the CVD reaction chamber;

introducing from about 10 to 200 sccm $O_2$ gas into the CVD reaction chamber;

employing an high frequency radio frequency (HFRF) power of from about 0 watts to 4 kilowatts; and employing an low frequency radio frequency (LFRF) power of from about 1000 to 5000 watts;

to synthesize the phoslon using a high density plasma chemical vapor deposition (HDPCVD) method.

10. The method of claim 1, wherein the phoslon etch stop layer is formed using the following steps:

providing a chemical vapor deposition (CVD) reaction chamber having a reaction temperature of from about 350 to 550° C.;

introducing from about 30 to 150 sccm $PH_3$ gas, from about 100 to 3000 sccm $N_2$ gas and from about 100 to 800 sccm $NH_3$ gas into the CVD reaction chamber;

introducing from about 30 to 150 sccm $O_2$ gas into the CVD reaction chamber;

employing an high frequency radio frequency (HFRF) power of from about 100 watts to 3.5 kilowatts; and employing an low frequency radio frequency (LFRF) power of from about 1500 to 4500 watts;

to synthesize the phoslon using a high density plasma chemical vapor deposition (HDPCVD) method.

11. A method of forming a dual damascene structure, comprising the steps of:

providing a substrate having an exposed metal structure formed therein;

forming a lower etch stop layer over the substrate and the exposed metal structure;

forming a first dielectric layer over the lower etch stop layer;

forming a middle etch stop layer over the first dielectric layer;

forming a second dielectric layer over the middle etch stop layer;

patterning and etching the second dielectric layer, the middle etch stop layer and the first dielectric layer to form a via opening exposing a portion of the lower etch stop layer;

patterning and etching the second dielectric layer, stopping on the patterned middle etch stop layer, to form a trench opening over the remaining via opening; the trench opening and the underlying remaining via opening comprising a dual damascene opening; the dual damascene opening having exposed walls;

removing the exposed portion of the lower etch stop layer to expose a portion of the metal structure;

forming a barrier layer at least over the exposed walls of the dual damascene opening; and forming a dual damascene structure within the barrier layer lined dual damascene opening;

wherein either the middle etch stop layer or the lower etch stop layer is comprised of phoslon.

12. The method of claim 11, wherein the middle etch stop layer or the lower etch stop layer comprised of phoslon is formed using the following steps:

providing a chemical vapor deposition (CVD) reaction chamber having a reaction temperature of from about 300 to 600° C.;

introducing from about 10 to 200 sccm $PH_3$ gas, from about 50 to 4000 sccm $N_2$ gas and from about 50 to 1000 sccm $NH_3$ gas into the CVD reaction chamber;

introducing from about 10 to 200 sccm $O_2$ gas into the CVD reaction chamber;

employing an high frequency radio frequency (HFRF) power of from about 0 watts to 4 kilowatts; and employing an low frequency radio frequency (LFRF) power of from about 1000 to 5000 watts;

to synthesize the phoslon using a high density plasma chemical vapor deposition (HDPCVD) method.

13. The method of claim 11, wherein the middle etch stop layer and the lower etch stop layer are each comprised of phoslon.

14. The method of claim 11, wherein the middle etch stop layer has a thickness of from about 100 to 1000 Å and the lower etch stop layer has a thickness of from about 100 to 1000 Å.

15. The method of claim 11, wherein the middle etch stop layer has a thickness of from about 200 to 700 Å and the barrier layer has a thickness of from about 200 to 700 Å.

16. The method of claim 1, wherein the phoslon etch stop layer is formed using the following steps:

providing a chemical vapor deposition (CVD) reaction chamber having a reaction temperature of from about 300 to 600° C.;

introducing from about 10 to 200 sccm $PH_3$ gas, from about 50 to 4000 sccm $N_2$ gas and from about 50 to 1000 sccm $NH_3$ gas into the CVD reaction chamber;

introducing from about 50 to 1000 sccm $N_2O$ gas into the CVD reaction chamber;

employing an high frequency radio frequency (HFRF) power of from about 50 to 1000 watts; and employing an low frequency radio frequency (LFRF) power of from about 0 to 1000 watts;

to synthesize the phoslon using a plasma enhanced chemical vapor deposition (PECVD) method.

17. The method of claim 1, wherein the phoslon etch stop layer is formed using the following steps:

providing a chemical vapor deposition (CVD) reaction chamber having a reaction temperature of from about 350 to 550° C.;

introducing from about 30 to 150 sccm $PH_3$ gas, from about 100 to 3000 sccm $N_2$ gas and from about 100 to 800 sccm $NH_3$ gas into the CVD reaction chamber;

introducing from about 100 to 800 sccm $N_2O$ gas into the CVD reaction chamber;

employing an high frequency radio frequency (HFRF) power of from about 100 to 700 watts; and employing an low frequency radio frequency (LFRF) power of from about 50 to 700 watts;

to synthesize the phoslon using a plasma enhanced chemical vapor deposition (PECVD) method.

18. The method of claim 11, wherein the middle etch stop layer or the lower etch stop layer comprised of phoslon is formed using the following steps:

providing a chemical vapor deposition (CVD) reaction chamber having a reaction temperature of from about 300 to 600° C.;

introducing from about 10 to 200 sccm $PH_3$ gas, from about 50 to 4000 sccm $N_2$ gas and from about 50 to 1000 sccm $NH_3$ gas into the CVD reaction chamber;

introducing from about 50 to 1000 sccm $N_2O$ gas into the CVD reaction chamber;

employing an high frequency radio frequency (HFRF) power of from about 50 to 1000 watts; and employing an low frequency radio frequency (LFRF) power of from about 0 to 1000 watts;

to synthesize the phoslon using a plasma enhanced chemical vapor deposition (PECVD) method.

19. The method of claim 1, wherein the phoslon etch stop layer is formed using a chemical vapor deposition (CVD) reaction chamber having a reaction temperature of from about 350 to 400° C.

20. The method of claim 11, wherein the phoslon etch stop layer is formed using a chemical vapor deposition (CVD) reaction chamber having a reaction temperature of from about 350 to 400° C.

21. The method of claim 11, wherein the middle etch stop layer or the lower etch stop layer comprised of phoslon is formed using the following steps:

providing a chemical vapor deposition (CVD) reaction chamber having a reaction temperature of from about 350 to 550° C.;

introducing from about 30 to 150 sccm $PH_3$ gas, from about 100 to 3000 sccm $N_2$ gas and from about 100 to 800 sccm $NH_3$ gas into the CVD reaction chamber;

introducing from about 100 to 800 sccm $N_2O$ gas into the CVD reaction chamber;

employing an high frequency radio frequency (HFRF) power of from about 100 to 700 watts; and employing an low frequency radio frequency (LFRF) power of from about 50 to 700 watts;

to synthesize the phoslon using a plasma enhanced chemical vapor deposition (PECVD) method.

22. The method of claim 21, wherein the phoslon etch stop layer is formed using the following steps:

providing a chemical vapor deposition (CVD) reaction chamber having a reaction temperature of from about 350 to 550° C.;

introducing from about 30 to 150 sccm $PH_3$ gas, from about 100 to 3000 sccm $N_2$ gas and from about 100 to 800 sccm $NH_3$ gas into the CVD reaction chamber;

introducing from about 30 to 150 sccm $O_2$ gas into the CVD reaction chamber;

employing an high frequency radio frequency (HERE) power of from about 100 to 3.5 kilowatts; and employing an low frequency radio frequency (LFRF) power of from about 1500 to 4500 watts;

to synthesize the phoslon using a high density plasma chemical vapor deposition (HDPCVD) method.

23. A method of forming borderless contact openings, comprising the steps of:
providing a substrate having a gate electrode formed thereover; the gate electrode having a gate suicide layer formed thereover;
forming source/drain implants into the substrate proximate the gate electrode;
forming a phoslon etch stop layer over the substrate and over the gate electrode at a temperature of from about 350 to 400° C.;
forming a dielectric layer over the phoslon etch stop layer; and
patterning and etching the dielectric layer and the phoslon etch stop layer to form at least one borderless contact opening over at least the gate electrode or at least one of the source/drain implants.

24. A method of forming a dual damascene structure, comprising the steps of:
providing a substrate having an exposed metal structure formed therein;
forming a lower etch stop layer over the substrate and the exposed metal structure;
forming a first dielectric layer over the lower etch stop layer;
forming a middle etch stop layer over the first dielectric layer;
forming a second dielectric layer over the middle etch stop layer;
patterning and etching the second dielectric layer, the middle etch stop layer and the first dielectric layer to form a via opening exposing a portion of the lower etch stop layer;
patterning and etching the second dielectric layer, stopping on the patterned middle etch stop layer, to form a trench opening over the remaining via opening; the trench opening and the underlying remaining via opening comprising a dual damascene opening; the dual damascene opening having exposed walls;
removing the exposed portion of the lower etch stop layer to expose a portion of the metal structure;
forming a barrier layer at least over the exposed walls of the dual damascene opening; and
forming a dual damascene structure within the barrier layer lined dual damascene opening;
wherein either the middle etch stop layer or the lower etch stop layer is comprised of phoslon formed at a temperature of from about 350 to 400° C.

25. The method of claim 1, wherein the phoslon etch stop layer serves as a buffering layer whereby there is no mobile ion diffusion through the phoslon etch stop layer.

26. The method of claim 1, wherein the phoslon etch stop layer is formed at a temperature of from about 300 to 400° C.

27. The method of claim 1, wherein the phoslon etch stop layer is formed at a temperature of from about 350 to 400° C.

28. The method of claim 11, wherein the phoslon middle etch stop layer or phoslon lower etch stop layer is formed at a temperature of from about 300 to 400° C.

29. The method of claim 11, wherein the phoslon middle etch stop layer or phoslon lower etch stop layer is formed at a temperature of from about 350 to 400° C.

* * * * *